United States Patent
Weidman et al.

[11] Patent Number: 6,090,530
[45] Date of Patent: *Jul. 18, 2000

[54] METHOD AND APPARATUS FOR DEPOSITING DEEP UV PHOTORESIST FILMS

[75] Inventors: Timothy Weidman, Sunnyvale; Dian Sugiarto, Union City, both of Calif.

[73] Assignee: Applied Materials, Inc., Santa Clara, Calif.

[*] Notice: This patent is subject to a terminal disclaimer.

[21] Appl. No.: 09/165,235

[22] Filed: Oct. 1, 1998

Related U.S. Application Data

[63] Continuation of application No. 08/745,565, Nov. 8, 1996.

[51] Int. Cl.⁷ .......................................................... G03C 5/00
[52] U.S. Cl. .......................... 430/315; 430/298; 522/172; 427/489
[58] Field of Search .................................. 430/298, 315, 430/327, 324; 427/489; 522/172

[56] References Cited

U.S. PATENT DOCUMENTS

| | | | |
|---|---|---|---|
| 5,052,339 | 10/1991 | Vakerlis et al. | 118/723 |
| 5,093,153 | 3/1992 | Brochot et al. | 427/41 |
| 5,318,877 | 6/1994 | Ober et al. | 430/270 |
| 5,346,803 | 9/1994 | Crivello et al. | 430/270 |
| 5,355,832 | 10/1994 | Loh et al. | 118/723 MW |
| 5,439,780 | 8/1995 | Joshi et al. | 430/296 |
| 5,487,967 | 1/1996 | Hutton et al. | 430/322 |
| 5,558,717 | 9/1996 | Zhao et al. | 118/715 |
| 5,569,497 | 10/1996 | Verzaro et al. | 427/489 |
| 5,635,338 | 6/1997 | Joshi et al. | 430/325 |
| 5,885,751 | 3/1999 | Weidman | 430/315 |

FOREIGN PATENT DOCUMENTS

| | | | |
|---|---|---|---|
| 0 382932 A2 | 8/1990 | European Pat. Off. | G03F 7/075 |
| 0 714 998 A2 | 6/1996 | European Pat. Off. | C23C 16/44 |
| 56-125434 | 10/1981 | Japan | C08J 7/04 |

OTHER PUBLICATIONS

T.W. Weidman et al., "New Photodefinable Glass Etch Masks for Entirely Dry Photolithography: Plasma Deposited Organosilicon Hydride Polymers," *Applied Physics Letters*, vol. 62, No. 4, pp. 372–374 (Jan. 1993).

T.W. Weidman et al., "All Dry Lithography: Applications of Plasma Polymerized Methylsilane as a Single Layer Resist and Silicon Dioxide Precursor," *Journal of Photopolymer Science and Technology*, vol. 6, No. 4, pp. 679–686 (1995).

*Primary Examiner*—Kathleen Duda
*Attorney, Agent, or Firm*—Townsend & Townsend & Crew

[57] ABSTRACT

An improved method and apparatus for forming a plasma-polymerized methylsilane (PPMS) photo-sensitive resist material includes the steps of pressurizing the chamber to between about 1 to about 2 Torr, heating the substrate to between about 50° C. and about 200° C., and plasma-polymerizing the precursor methylsilane gas to deposit a stable film having high-photosensitivity at high deposition rates.

6 Claims, 7 Drawing Sheets

METHOD AND APPARATUS FOR DEPOSITING DEEP UV PHOTORESIST FILMS

CROSS-REFERENCE TO RELATED APPLICATIONS

This application is a continuation of U.S. application Ser. No. 08/745,565, filed Nov. 8, 1996, entitled "METHOD AND APPARATUS FOR CLEANING A VACUUM LINE IN A CVD SYSTEM," and having Timothy Weidman and Dian Sugiarto listed as co-inventors and assigned to Applied Materials, Inc.

BACKGROUND OF THE INVENTION

1. Field of the Invention

The present invention relates generally a method and apparatus for photolithographic semiconductor processing and more particularly to method and apparatus for depositing photoresist films.

2. Description of the Relevant Art

Deposition of plasma polymerized methylsilane (PPMS) photoresist layers has been described in: an article by Weidman et al. entitled "New photodefinable glass etch masks for entirely dry photolithography: Plasma deposited organosilicon hydride polymers", published in *Applied Physics Letters,* Vol. 62, No. 4, Jan. 25, 1993, pp. 372–374; U.S. Pat. No. 5,439,780 to Joshi et al.; and an article by Weidman et al. entitled "All Dry Lithography: Applications of Plasma Polymerized Methylsilane as a Single Layer Resist and Silicon Dioxide Precursor" published in *Journal of Photopolymer Science and Technology,* Vol. 8, No. 4 (1995), pp. 679–686. As described in these references, a PPMS film having an amorphous organosilicon hydride network structure is deposited by plasma polymerization of a methylsilane precursor gas. When the PPMS film is exposed to UV radiation in the presence of an oxidant such as ambient air, exposed portions of the PPMS film undergo photo-oxidation to form a glasslike, siloxane network material (PPMSO). The resulting patterns can be developed utilizing chlorine plasma etching to provide negative tone patterns. Optionally, the developed pattern may be further oxidized and annealed to convert the remaining material to a hard oxide suitable for further processing. Advantageously, the deposition, development, patterning, and etching steps may all be performed in the gas phase, i.e., using dry plasma processing techniques.

For use in commercial processes, a PPMS film is required to have: (a) good stability, (b) high photosensitivity; and (c) a high deposition rate. Stability of a photoresist film relates to its resistance to degradation of exposure and processing characteristics when the film is exposed to oxidants such as ambient oxygen after the film is removed from a deposition chamber. Typically, in commercial processes the film may not be developed immediately after exposure. Thus, if the film is not stable, the exposed pattern will degrade before the film is developed. Photosensitivity of the photoresist film is the exposure dose (measured, for example, as $mJcm^{-2}$) required to develop patterns that are useful in subsequent pattern transfer steps. High photosensitivity is required in commercial processes so that a short exposure time can be utilized for each substrate. Lastly, deposition rate of the photoresist film (measured, for example, as Å/min) is the rate of increase of the film thickness during deposition. High deposition rates are required for high throughput.

The processes for depositing PPMS films disclosed in the above-identified references are not suitable for commercial use. Specifically, the references disclosed PPMS film deposition at low (ambient) temperature and at low (approximately 500 mTorr) pressure to avoid deposition of particles. However, the disclosed deposition rates at the low temperature and pressure are too low for commercial processes that require high wafer throughput.

Thus, in light of the above, there is a need in the art for commercially useful method and apparatus for depositing PPMS film.

SUMMARY OF THE INVENTION

Embodiments of the present invention are commercially useful method and apparatus for depositing PPMS photoresist film. The resulting PPMS films are useful because thin, conformal, pinhole-free films can be deposited for use in patterning small features, which films can be exposed using 248 nm and/or 193 nm DUV and developed to form patterns with very small features.

According to one aspect of the invention, a PPMS film is formed at elevated temperature and pressure. Advantageously, the resulting PPMS film is deposited at a sufficiently high deposition rate and has sufficiently high stability and photosensitivity to be useful in commercial applications. Additionally, since the PPMS film can be patterned by deep UV at 193 nm and, in accordance with the present invention, it can be conformally deposited while being substantially free of particle and pinhole defects, the PPMS film can be effectively used to pattern feature sizes down to about 0.15 microns.

According to another aspect of the invention, a stable PPMS film having high photosensitivity is deposited on a substrate heated to a temperature in a range from about 50° C. to 200° C. by introducing a precursor gas comprised of methylsilane at a flow rate of between 20 sccm and 150 sccm into a deposition chamber pressurized to between 1 Torr and 2 Torr and plasma polymerizing the precursor gas by applying RF power of between about 0.05 $Wcm^{-2}$ to 0.2 $Wcm^{-2}$ to an electrode in the chamber.

Other features and advantages of the invention will be apparent in view of the following detailed description and appended drawings.

DETAILED DESCRIPTION OF THE PREFERRED EMBODIMENTS

I. Exemplary CVD System

Figure 1A:
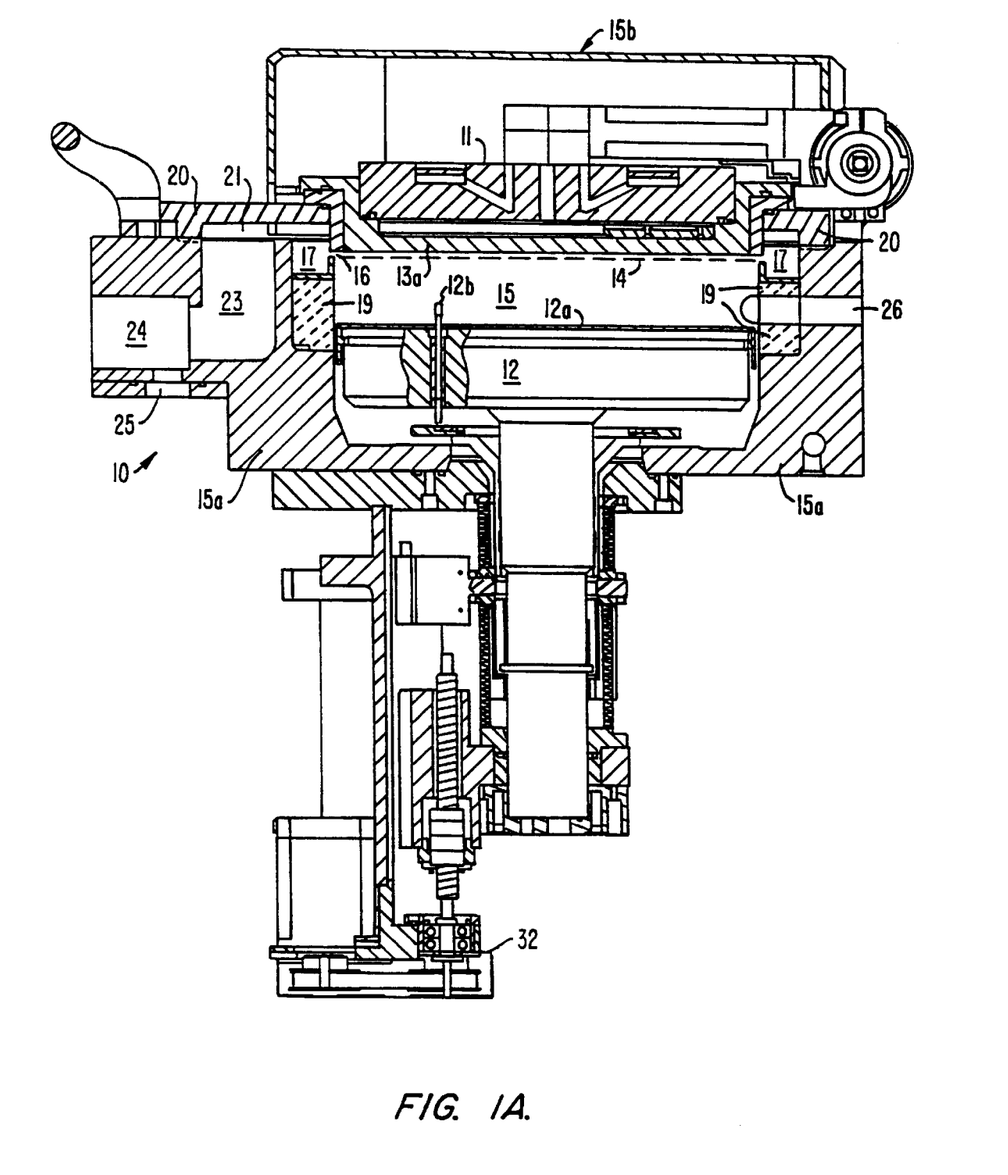
FIGS. 1A and 1B are vertical, cross-sectional views of one embodiment of a chemical vapor deposition apparatus according to the present invention.
Figure 1B:
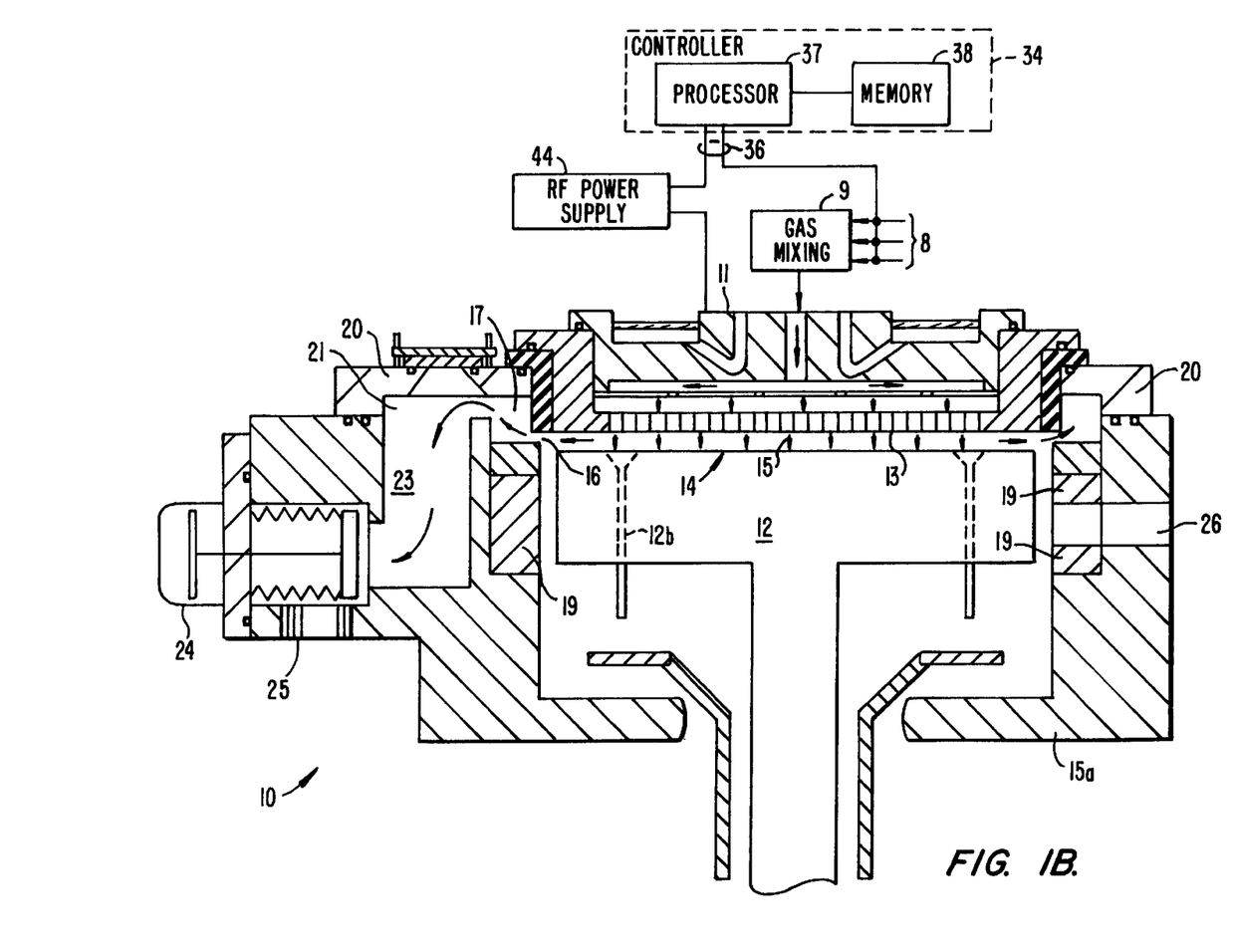
Figure 1C:
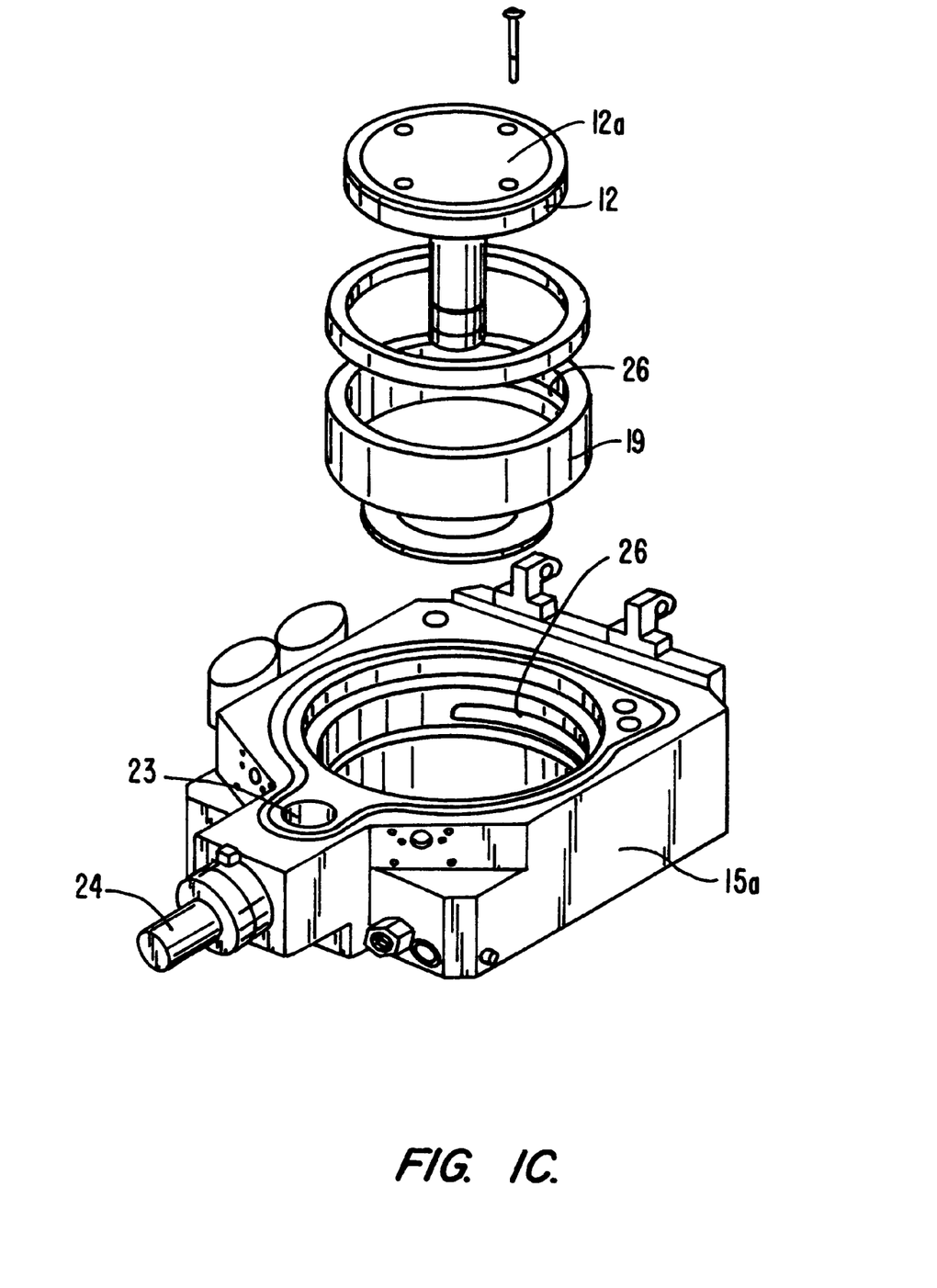
FIGS. 1C and 1D are exploded perspective views of parts of the CVD chamber depicted in FIG. 1A.
Figure 1D:
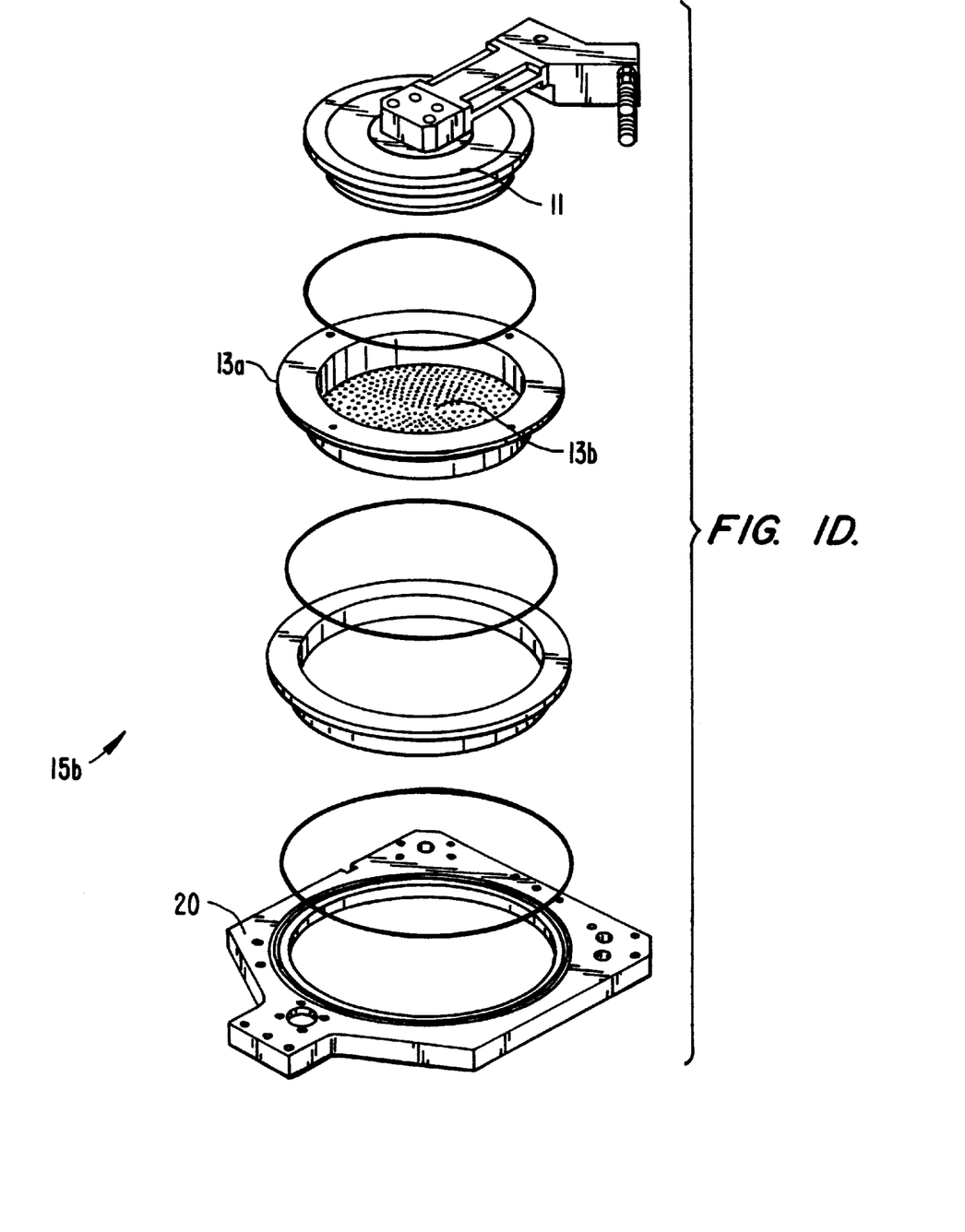

One suitable CVD machine in which the method of the present invention can be carried out is shown in FIGS. 1A and 1B which are vertical, cross-sectional views of a chemical vapor deposition reactor 10 having a vacuum chamber 15 including a chamber wall 15a and chamber lid assembly 15b. The chamber parts are shown in perspective in FIGS. 1C and 1D.

Reactor 10 contains a gas distribution manifold 11 for dispersing process gases through perforated holes in the manifold to a wafer (not shown) that rests on a support face 12a of susceptor 12. Before reaching manifold 11, process gases are input through gas supply lines 18 into a mixing system 19 where they are combined and then sent to manifold 11. Generally, the gas supply lines for each of the process gases include (i) safety shut-off valves (not shown) that can be used to automatically or manually shut off the flow of process gas into the chamber, and (ii) mass flow controllers (also not shown) that measure the flow of gas through the gas supply lines.

Heated susceptor 12 is centered within reactor 10 and support face 12a having a flat (or slightly convex), circular face supports a semiconductor wafer or substrate (not shown) thereon. Susceptor 12 can be controllably moved between a lower loading/off-loading position (depicted in FIG. 1A) and an upper processing position (indicated by dashed line 14 in FIG. 1A and shown in FIG. 1B) which is closely adjacent to manifold 11. A centerboard (not shown) includes sensors for providing information on the position of the wafers. Support face 12a is parallel to a process gas distribution faceplate 13a having holes 13b (FIG. 1D) through which process gases enter chamber 15. More specifically, process gases flow into the chamber through the inlet manifold 11, and through the holes 13b in a conventional flat, circular gas distribution faceplate 13a.

The deposition process described in this specification is a plasma induced process. An RF power supply 44 applies electrical power between gas distribution faceplate 13a and susceptor 12 so as to excite the process gases to form a plasma within the cylindrical region between faceplate 13a and susceptor 12 (referred to as the "reaction region"). RF power supply 44 typically supplies power at a high RF frequency (RF1) of 13.56 MHz. The constituents of the plasma react to deposit a desired film on the surface of the semiconductor wafer supported on support face 12a.

The portion of the process gases that are not deposited on the substrate and gaseous reaction products are evacuated from the process chamber by a vacuum pump (not shown). Specifically, the gases are exhausted through an annular, slot-shaped orifice 16 surrounding the reaction region and into an annular exhaust plenum 17. Annular slot-shaped orifice 16 is defined by a gap between the chamber lid and an upper dielectric lining 27 and exhaust plenum 17 is defined by a passageway between the top of the chamber's cylindrical side wall 15a (including the upper dielectric lining 27) and the bottom of circular chamber lid 20. Gases flow underneath a lateral extension portion 21 of exhaust plenum 17, past a viewing port 22, through a downward-extending gas passage 23, past a vacuum shut off valve 24 (whose body is integrated with lower chamber body 15a), and into the exhaust outlet 25 which connects to the external vacuum pump (not shown). The 360° circular symmetry and uniformity of slot-shaped orifice 16 and exhaust plenum 17 are important for achieving a uniform flow of process gases over the wafer so as to deposit a uniform film on the wafer.

Typically, a liquid is circulated through walls 15a of the process chamber to maintain the chamber at a controlled temperature between 20° C. and 100° C. Fluids used to heat the chamber walls 15a include the typical fluid types, i.e., water-based ethylene glycol or oil-based thermal transfer fluids.

Susceptor 12 (preferably made of aluminum) is heated using a double full-turn single-loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of susceptor 12. Alternatively, the temperature of the susceptor may be controlled by circulating a temperature controlled liquid through an embedded loop.

Typically, any or all of the chamber lining, gas inlet manifold faceplate, and various other reactor hardware are made out of material such as aluminum, anodized aluminum, or aluminum oxide (alumina). An example of such a CVD apparatus is described in a U.S. Pat. No. 5,558,717, entitled "CVD Processing Chamber," issued to Zhao et al. and assigned to Applied Materials, Inc., the assignee of the present invention.

Lift mechanism and motor 32 raises and lowers susceptor 12 and wafer lift pins 12b as wafers are transferred into and out of the body of the chamber by a robot blade (not shown) through an insertion/removal opening 26 in the side of chamber 15. The motor 32 raises and lowers susceptor 12 between a processing position 14 and a lower, wafer-loading position.

Motor 32, valves and flow controllers connected to gas supply lines 18, gas mixing system 19, throttle valve 24, RF power supply 44 and the substrate heating system are controlled by a system controller 34 over control lines 36 of which only some are shown. System controller controls are the system elements by executing system control software stored in a memory 38, which, in the preferred embodiment is a hard disk drive. Motors and optical sensors are used to move and determine the position of movable mechanical assemblies such as the throttle valve and susceptor.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single-board computer (SBC) processor 37, analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

Figure 1E:
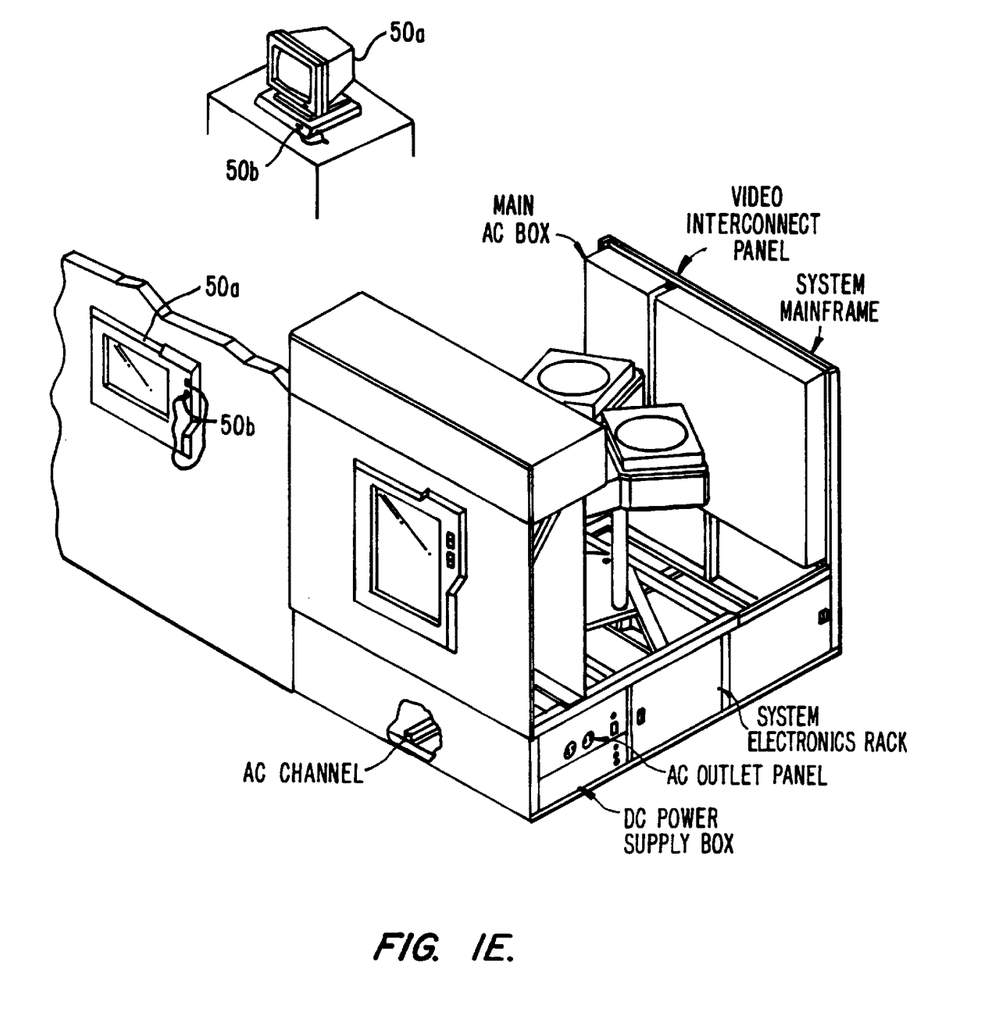
FIG. 1E is a simplified diagram of system monitor and CVD system 10 in a multi-chamber system, which may include one or more chambers.

The interface between a user and processor 34 is via a CRT monitor 50a and lightpen 50b, shown in FIG. 1E which is a simplified diagram of the system monitor and CVD system 10 in a multi-chamber system, which may include one or more chambers. In the preferred embodiment two monitors 50a are used, one mounted in the clean room wall for the operators and the other behind the wall for the service technicians. Both monitors 50a simultaneously display the same information, but only one lightpen 50b is enabled. A light sensor in the tip of the lightpen 50b detects light emitted by CRT display. To select a particular screen or function, the operator touches a designated area of the display screen and pushes the button on the pen 50b. The touched area changes its highlighted color, or a new menu or screen is displayed, confirming communication between the lightpen and the display screen. Of course, other devices, such as a keyboard, mouse, or other pointing or communication device, may be used instead of or in addition to lightpen 50b to allow the user to communicate with processor 34.

The process for depositing the film can be implemented using a computer program product that is executed by processor 34. The computer program code can be written in any conventional computer readable programming language, such as 68000 assembly language, C, C++, Pascal, or Fortran. Suitable program code is entered into a single file, or multiple files, using a conventional text editor, and are stored or embodied in a computer usable medium, such as a memory system of the computer. If the entered code text is in a high level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to perform the tasks identified in the program.

Figure 1F:
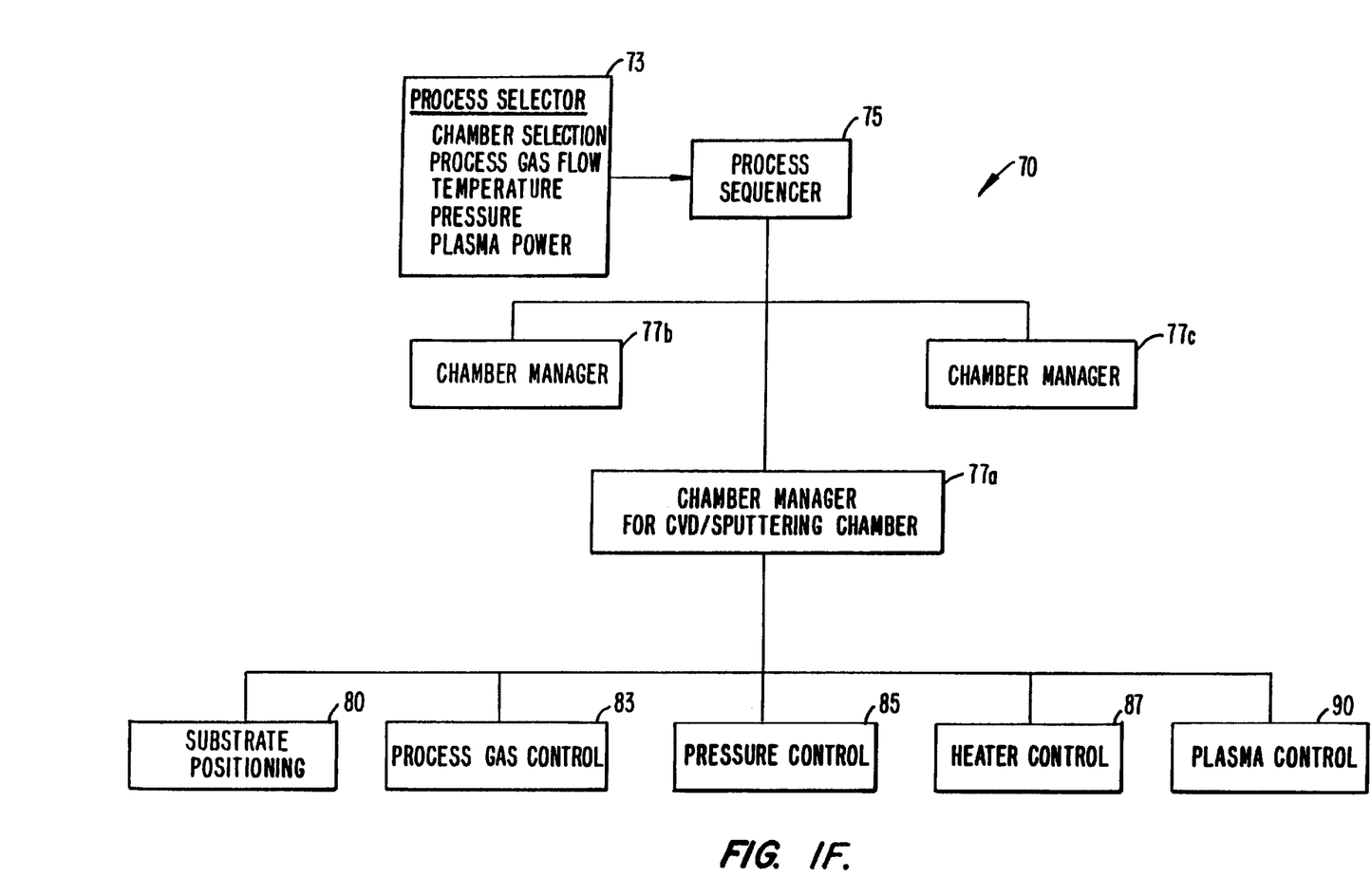
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. Using a lightpen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the lightpen/CRT monitor interface.

The signals for monitoring the process are provided by the analog and digital input boards of the system controller and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set are to be executed next. Typically, the chamber manager subroutine 77a includes steps of monitoring the various chamber components; determining which components need to be operated, based on the process parameters for the process set to be executed; and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the susceptor 12, and, optionally, to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and for activating the safety shut-off valves when an unsafe condition is detected.

In some processes, an inert gas such as argon or nitrogen is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to heating unit that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12a, compares the measured temperature to the setpoint temperature, and increases or decreases current applied to the heating unit to obtain the setpoint temperature. The temperature is obtained from the measured voltage by looking up the corresponding temperature in a stored conversion table, or by calculating the temperature using a fourth order polynomial. When an embedded loop is used to heat the susceptor 12a, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting high frequency RF power levels applied to the upper electrodes in the chamber 15. Similar to the previously described chamber component subroutines, the plasma control subroutine 90 is invoked by the chamber manager subroutine 77a.

The above reactor description is mainly for illustrative purposes, and similar plasma CVD equipment may be used within the specified operating parameters to produce suitably useful films. Additionally, variations of the above described system such as variations in susceptor design, heater design, RF power frequencies, location of RF power connections and others are possible. The layer and method for forming such a layer of the present invention is not limited to any specific apparatus or to any specific plasma excitation method.

II. Deposition of a Stable, High-Photosensitivity Resist Layer

EXAMPLE 1

In a first embodiment, a PPMS deposition process was performed in a chamber as described above in Part I, i.e., a 200 mm DxZ chamber manufactured by Applied Materials, Inc. of Santa Clara, Calif. having a standard 200 mm silane faceplate and blocker plate and a standard 200 mm resistively heated susceptor was connected to a Centura mainframe also manufactured by Applied Materials, Inc. The improved process for depositing the PPMS film on a 200 mm substrate will now be described with reference to the flow chart of FIG. 2. Subsequent to stabilizing the chamber pressure to a processing pressure of between 1 and 2 Torr and heating the substrate to temperature of between 50° C. to 200° C., the PPMS film is deposited by introducing a precursor gas of methylsilane into the chamber at a flow rate of between 20 to 150 sccm and striking a plasma.

Figure 2:
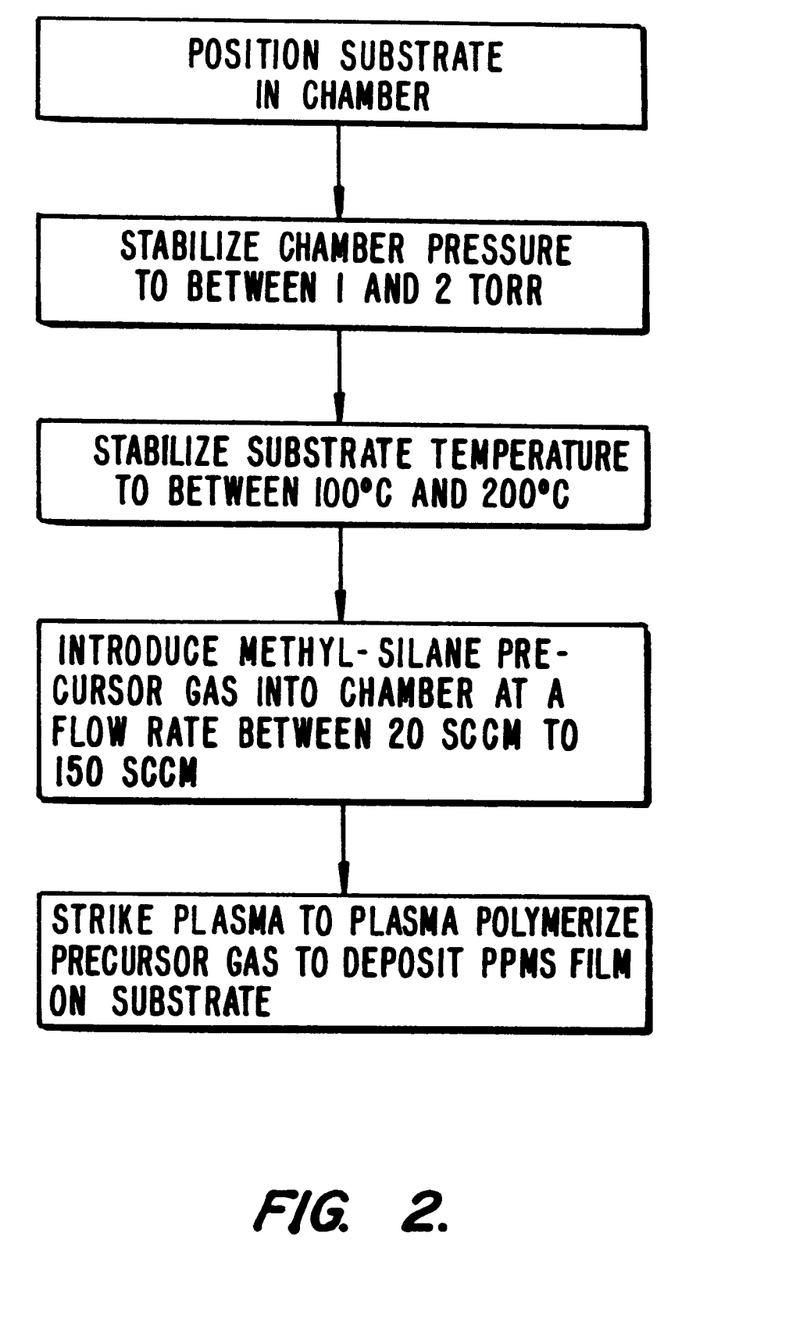
FIG. 2 is a flowchart illustrating steps undertaken in formation of a PPMS film according to one embodiment of the method of the present invention.

The power applied to the plasma electrode has a value of between 50 to 200 Watts. In the chamber of the preferred embodiment the area of the power electrode is about $10^3$ cm$^2$ so that the power per unit area of the electrode is between about 0.05 Wcm$^{-2}$ and about 0.20 Wcm$^{-2}$. The electrode spacing is between 300 and 700 mils.

The deposition rate of the PPMS film was between 1,000 and 2,000 Å/min which is sufficiently high for commercial applications. The deposited films exhibited high stability, high photosensitivity, and good etch selectivity. The stability was measured by change of refractive index of the film over time. Specifically, the films were kept in the dark at atmospheric pressure for 24 hours and exhibited a change in the index of refraction of less than 0.10, i.e., dropping from initial values of 1.74–1.75 to about 1.66. Further, the deposited films exhibited an etch selectivity of 5:1 of PPMS/PPMSO (PPMSO is the material produced by photo-oxidation of PPMS) after an exposure dose of 50 mJ/cm$^2$ of broad-band deep UV light.

EXAMPLE 2

PPMS films nominally of 1,000 and 2,000 Å were deposited over a 200 mm wafer in the above-described 200 mm DxZ chamber. The films were deposited at the following System Operating Parameters:

| | |
|---|---|
| Power (RF1) | 90 Watt |
| Pressure | 1.7 Torr |
| Substrate Temperature | 150 °C. |
| Chamber wall temperature | 65 °C. |
| Electrode Spacing | 575 mil |
| $CH_3SiH_3$ flow rate | 80 sccm |

The films were examined using the following instrumentation and measurement techniques: film uniformity with respect to thickness was measured using a Prometrix SM-300 (49 point, 6 mm edge exclusion); refractive index and thickness were measured using a Rudolf dual wavelength ellipsometer; and particles were monitored using a Tencor Surfscan. We obtained the following results:

| | |
|---|---|
| Deposition Rate | 2,000 Å/min |
| Uniformity (49 point, 6 mm) | |
| Within wafer | 1.6% |
| Wafer to Wafer | 2.7% |
| Refractive Index (RI) | 1.74 |
| RI variation (49 point, 6 mm) | |
| Within Wafer | 0.017 |
| Wafer to wafer | 0.022 |
| Stability: | |
| RI 1 hour after deposition | 1.72 |
| Photosensitivity | |
| RI after exposure to broadband DUV (50 mJ/cm$^2$) | 1.53 |

Additionally, the number of particles detected was low enough to assure low defect density. It was observed that the higher temperature of the present process, relative to that of the previously reported conditions, reduced the formation or deposition of particles on the wafer and increased the stability of such films to storage in the air. Thus, by utilizing elevated temperature and pressure a film can be deposited at a high deposition rate that is sufficiently stabile and free of particle defects to be useful for forming patterns for small features.

The invention has now been described with reference to the preferred embodiments. Alternatives and substitutions will now be apparent to persons of skill in the art. In particular, the process parameters have been described with respect to specific chambers and substrate sizes. These parameters can be scaled for other chambers and substrate sizes without departing from the principles of the invention. For example, the flow rate of the precursor gas will vary with wafer size and chamber volume. However, for the processes described above, for a 200 mm wafer a layer of 1,000 Å is deposited with a flow rate of the precursor gas at 80 sccm for 30 seconds. Thus, the volume of methylsilane required to form the film is 40 scc. Although a precise formula for scaling is not practical a person of skill in the art will be enabled to scale the flow rate to deliver the correct amount of precursor gas to the chamber in view of the above specification. Similarly, the power applied to the electrode is distributed across the surface of the electrode. Thus, the power applied for unit area can be scaled for different chambers. Further, the ranges of parameter values described above are presented in connection with the description of the preferred embodiment and do not limit the invention. Accordingly, it is not intended to limit the scope of the invention except as provided by the appended claims.

What is claimed is:

1. A process for depositing a photo-sensitive resist layer on a substrate disposed in a substrate processing chamber, said process comprising the steps of:

(a) establishing a selected process pressure in said chamber;

(b) providing thermal energy to heat said substrate to temperature of between about 50° C. and about 200° C.;

after steps (a) and (b), flowing a precursor gas of methylsilane into said chamber; and providing electromagnetic energy to said electrode to strike a plasma to plasma-polymerize said precursor gas of methylsilane and to deposit a plasma-polymerized methylsilane (PPMS) layer on said substrate.

2. The process of claim 1 further comprising establishing a process pressure of between about 1 Torr and about 2 Torr driving the deposition of said PPMS layer.

3. A process for depositing a photo-sensitive resist layer on a substrate disposed in a substrate processing chamber, said process comprising:

(a) establishing a selected process pressure in said chamber of between about 1 Torr and about 2 Torr;

flowing a precursor gas of methylsilane into said chamber; and providing electromagnetic energy to said electrode to strike a plasma to plasma-polymerize said precursor gas of methylsilane and to deposit a plasma-polymerized methylsilane (PPMS) layer on said substrate.

4. The process of claim 3 wherein said process pressure is between 1 and 2 Torr.

5. The process of claim 3 further comprising heating said substrate to a temperature of between about 50° C. and about 200° C. during deposition of said PPMS layer.

6. A process for depositing a photo-sensitive resist layer on a substrate disposed in a substrate processing chamber, said process comprising:

(a) establishing a process pressure in the chamber of between about 1 Torr and about 2 Torr;

(b) providing thermal energy to heat said substrate to a temperature of between about 50° C. and about 200° C.;

(c) flowing a precursor gas of methylsilane into a reaction zone of the chamber;

(d) providing electromagnetic energy to an electrode of the chamber to strike a plasma from said methylsilane precursor gas; and (e) after steps (a) through (d), maintaining the chamber at a process pressure of between about 1 Torr and about 2 Torr, maintaining said substrate at a temperature of between about 50° C. and about 200° C., maintaining said flow of methylsilane and maintaining said plasma to deposit a plasma-polymerized methylsilane (PPMS) layer having a selected thickness over said substrate.

* * * * *